United States Patent [19]
Rauch et al.

[11] Patent Number: 5,279,724
[45] Date of Patent: Jan. 18, 1994

[54] DUAL SPUTTERING SOURCE

[75] Inventors: Russell B. Rauch, Pasadena; Chuong V. Tran, Lawndale, both of Calif.

[73] Assignee: Xerox Corporation, Stamford, Conn.

[21] Appl. No.: 813,540

[22] Filed: Dec. 26, 1991

[51] Int. Cl.$^5$ .............................................. C23C 14/34
[52] U.S. Cl. ........................... 204/298.09; 204/192.12; 204/298.19; 204/298.26
[58] Field of Search ...................... 204/192.12, 298.09, 204/298.19, 298.21, 298.26

[56] References Cited

U.S. PATENT DOCUMENTS

| | | | |
|---|---|---|---|
| 3,616,451 | 10/1971 | Gallez | 204/298.26 |
| 3,756,939 | 9/1973 | Hurwitt | 204/298.26 X |
| 3,779,885 | 12/1973 | Labedan et al. | 204/298.26 X |
| 4,401,539 | 8/1983 | Abe et al. | 204/298.19 X |
| 4,411,763 | 10/1983 | Itaba et al. | 204/298.26 X |
| 4,434,042 | 2/1984 | Keith | 204/298.16 X |

*Primary Examiner*—Nam Nguyen
*Attorney, Agent, or Firm*—Nola Mae McBain

[57] ABSTRACT

A compact dual sputtering device which has two adjacent sputtering sections within a housing. The sputtering sections are arranged along a common axis with each section having a ring magnet circumscribed around the axis and a pole magnet, the center of which generally extends along the axis. The ring magnets are axially spaced from each other and the pole magnets are axially spaced from each other with each pole magnet being surrounded by a respective one of the ring magnets leaving a generally annular space between each of the pole magnets and a respective one of the ring magnets. Each section has a target area located on the outer surface of the housing at opposite axial ends of the housing. The housing has fluid inlet means and fluid outlet means and passage means connecting the annular space of one sputtering section with the annular space of the other sputtering section. The fluid inlet means opens into the passage means upstream of fluid flow and the fluid outlet means opens into the passage means downstream of fluid flow so fluid enters the housing through the inlet means and circulates through the passage means and the annular spaces and out of the housing through the outlet means.

2 Claims, 9 Drawing Sheets

DUAL SPUTTERING SOURCE

BACKGROUND OF THE INVENTION

This invention relates generally to cold welding bonding processes and more particularly concerns a system in which acousto-optic modulators are prepared for bonding and then bonded to each other.

In cold welding applications, two essentially flat objects are coated with a cold welding material, such as indium, and then pressed together to bond the objects. One cold welding application is the production of acousto-optic modulators. An acousto-optic substrate and transducer are each:

(a) first coated in a vacuum with a thin film of indium, and
(b) assembled with a press in a vacuum without breaking the vacuum between steps (a) and (b).

Low product yield or undesirable amounts of malfunctioning parts are produced using conventional vacuum cold welding systems due to the following problems:

1) variable film quality due to boiling and spitting of thermal sources,
2) misalignment of substrate and transducer due to the large rotational angles the substrate and transducer must be rotated through, and
3) breakage of parts and non-uniform bonding adhesion due to substrate and transducer not being aligned parallel or co-planar to each other.

A vacuum cold welding system has been created which overcomes these limitations and has a greater yield of properly functioning parts.

Further advantages of the invention will become apparent as the following description proceeds.

SUMMARY OF THE INVENTION

A vacuum cold welding system has been designed to maximize yield and address the limitations of conventional cold welding systems. Several facets of the system have been redesigned including the method of coating the substrate and transducer, the method of aligning the substrate and transducer and the method of planarizing the substrate and transducer.

The vacuum cold welding system has been designed to utilize a bidirectional sputtering source which can simultaneously sputter coat the substrate and transducer. The sputtering source produces high quality films when oriented in any direction and allows the substrate and transducer to be translationally aligned, while separated axially for coating. A single sputtering device could be utilized, but to retain the alignment advantages of the device, it would need to be pivotable so that it could coat both upwards and downwards in sequential coating steps.

After coating both the substrate and transducer, the sputtering source is rotated away from the substrate and transducer and removed from the path of the press. Rotating the sputtering source eliminates the large rotational angles that the substrate and transducer would otherwise be rotated or translated through to be aligned in conventional vacuum cold welding systems using thermal sources for deposition of the indium.

The substrate and transducer are held by two separate chucks of the press. One of the chucks is mounted on a gimbal to allow free rotation during bonding to planarize the surfaces of the substrate and transducer relative to each other. The gimbal is designed for minimal translational movement during planarization to minimize shearing stresses on the bond.

Figure 1:
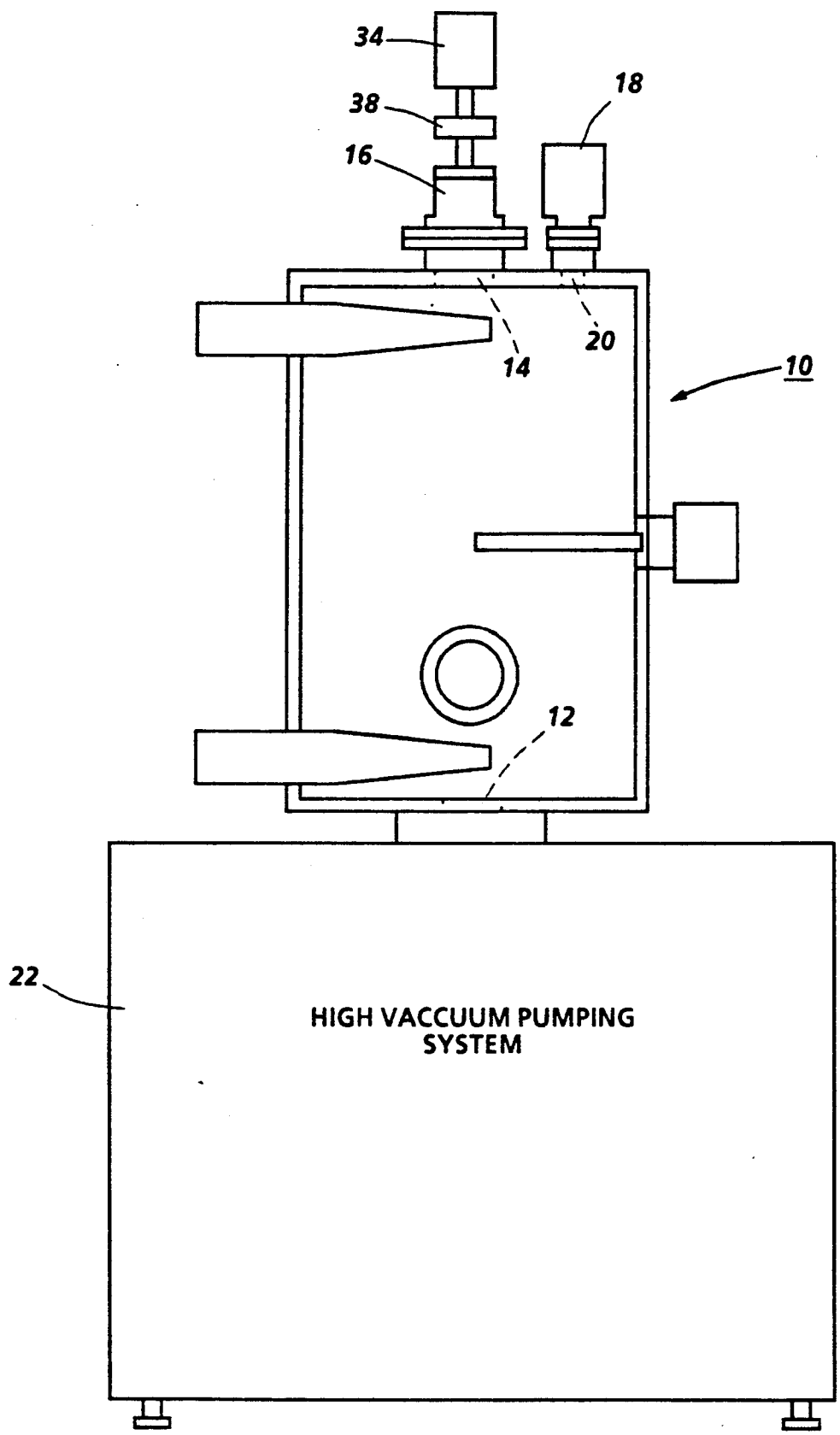
FIG. 1 is an outside view of the front of a cold welding system.

Alphanumeric list of parts included in the drawings:
A arc of sputtering equipment path
Ax axis of rotational symmetry
E electric field
M magnetic field
P substrate to transducer pressing path
W water flow path
10 vacuum chamber
12 vacuum pump port
14 rotary feedthrough port
16 rotary feedthrough
18 air cylinder
20 connecting rod port
22 high vacuum pumping system
24 apparatus
26 substrate
28 transducer
30 sputtering equipment
32 hollow rotating support arm
33 platform arm
34 stepper motor
36 stepper motor gear reduction equipment
38 flex coupling
40 key
42 water and electrical feedthrough
44 rotary solenoid
45 solenoid rod
46 shutter
47 shutter arm
48 first chuck with a tight clamp
50 second chuck with a loose clamp
52 double gimbal assembly
54 upper gimbal
56 lower gimbal
58 connecting rod
60 piston
62 die set upper shoe
64 die set lower shoe
66 die set forward shaft 68 die set rearward shaft
70 bellows seal
72 dual sputtering device
74 sputtering head
76 target
78 dual sputterer input water line
80 dual sputterer output water line
82 dual sputterer input electrical line
84 dual sputterer output electrical line
86 solenoid input electrical line
88 solenoid output electrical line
90 ring magnet
91 ring magnet
92 cylinder magnet
93 cylinder magnet
94 magnetic yoke
95 magnetic yoke
96 hollow cylindrical housing
98 end disk
99 end disk
100 target clamps
102 external housing
104 insulators While the present invention will be described in connection with a preferred embodiment, it will be understood that it is not intended to limit the invention to that embodiment. On the contrary, it is intended to cover all alternatives, modifications and equivalents as may be included within the spirit and scope of the invention as defined by the appended claims.

DETAILED DESCRIPTION OF THE INVENTION

Turning now to FIG. 1, the system comprises a vacuum chamber 10 with three ports, a vacuum pump port 12 for supplying a vacuum to the system, a connecting rod port 20 for the pressing apparatus, and a rotary feed through port 14.

The vacuum pump port 12 is attached to a conventional high vacuum pumping system 22. In this case a conventional system utilizing a HiVac Cryogenic pump and a roughing pump (not shown) are used.

Figure 2:
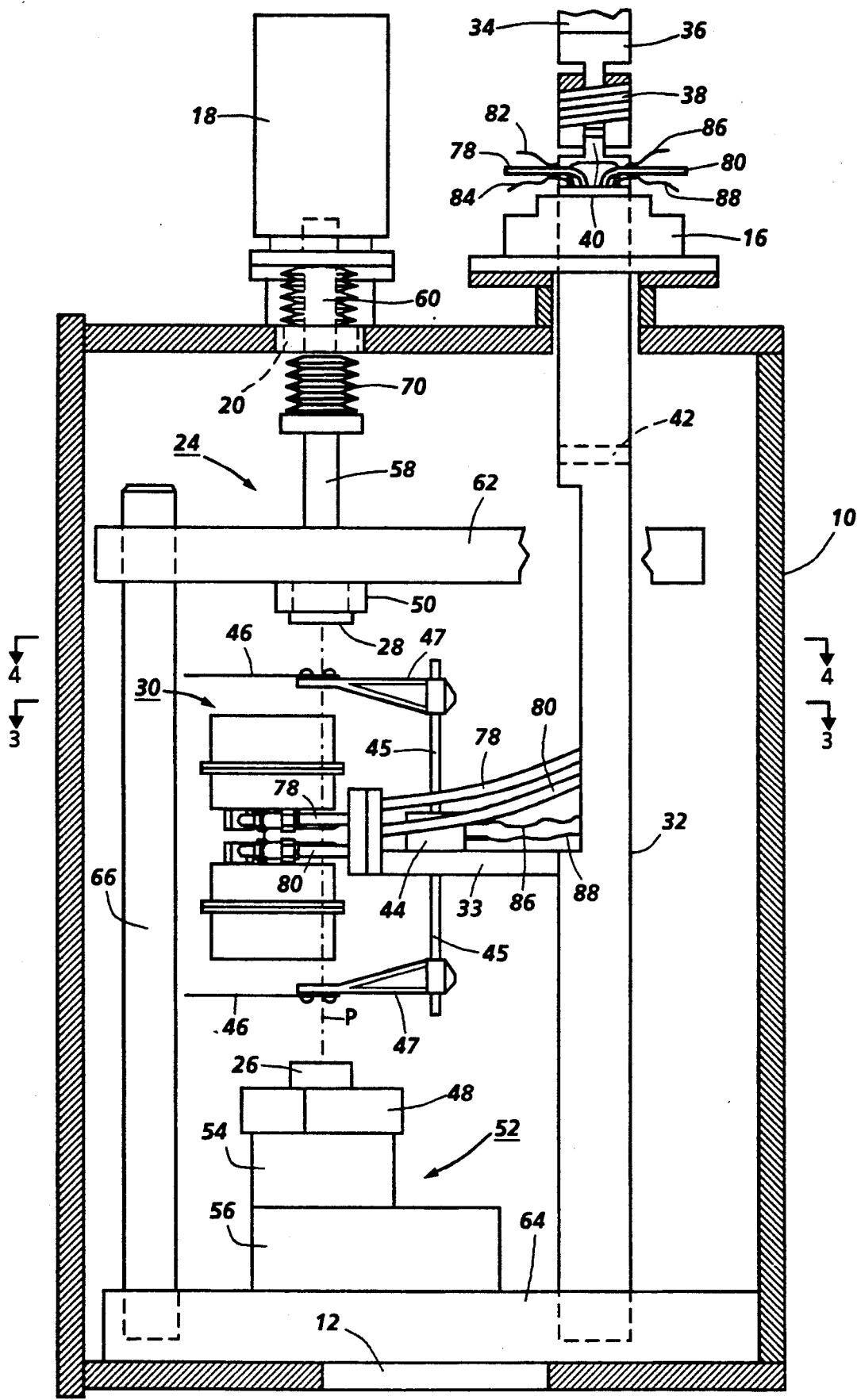
FIG. 2 is an inside view of the interior of a vacuum chamber and its contents.
Figure 3:
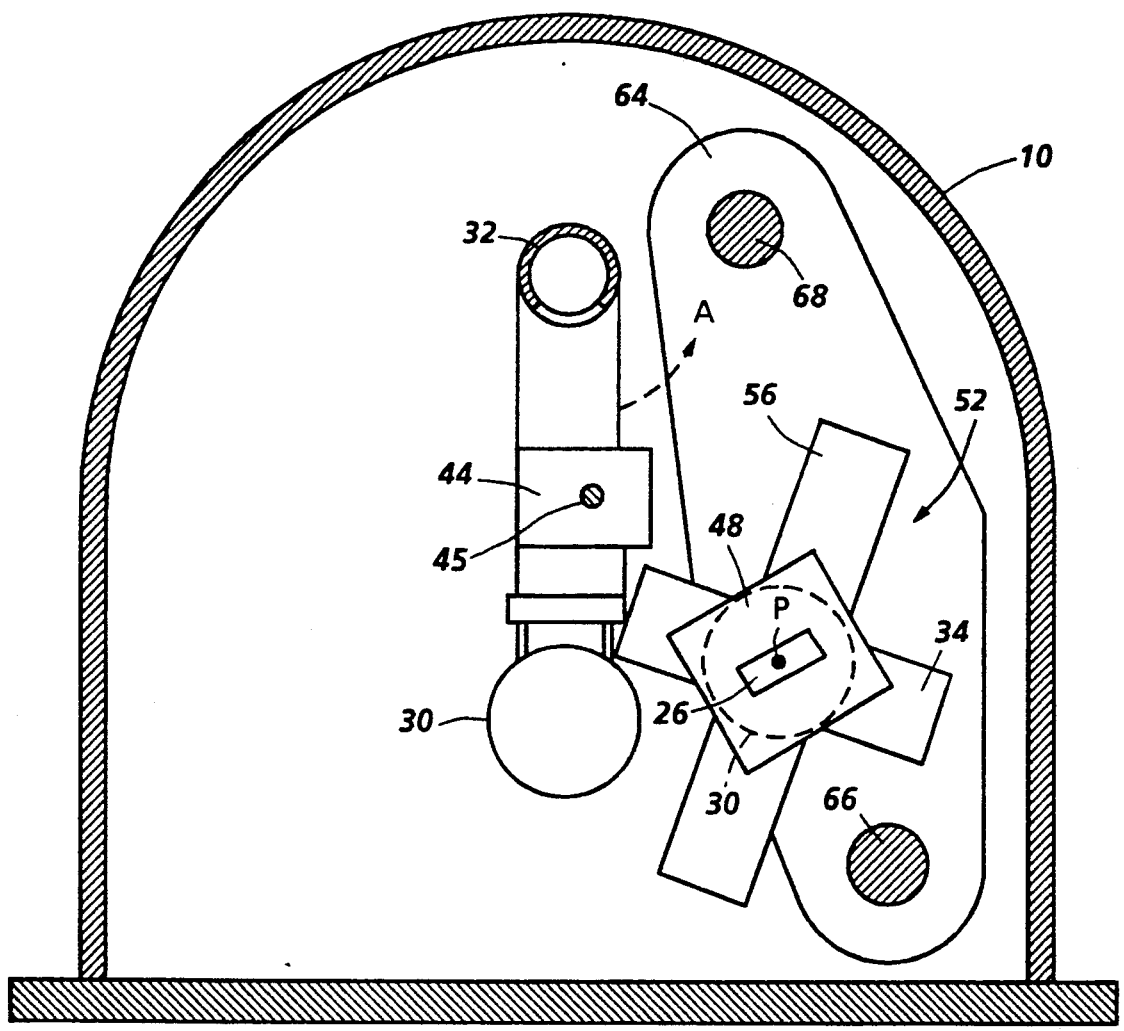
FIG. 3 is an inside cross sectional view taken along section line 3—3 of FIG. 2.

As shown in FIG. 2, the apparatus 24 for holding a substrate 26 and transducer 28 to be bonded in the vacuum chamber 10 has been designed so that substrate 26 and transducer 28 have translational alignment along the horizontal axes but are separated along the vertical axis or the pressing path P. This is the coating position of the substrate 26 and transducer 28. This eliminates the need for aligning the substrate 26 and transducer 28 before the substrate 26 and transducer 28 are pressed together. Sputtering equipment 30 for coating the substrates is mounted on a hollow rotating support arm 32 which rotates the sputtering apparatus along an arc A (FIG. 3), into and back out of the pressing path P between the substrate 26 and transducer 28. The pressing path P is shown in FIG. 3 as the vertical axis extending outward and normal to the plane of the paper. For coating, the sputtering equipment 30 is rotated between the substrate 26 and transducer 28 into the sputtering or coating position, shown in phantom, which intersects with pressing path P. The sputtering equipment 30 is located between and aligned with the substrate 26 and transducer 28. After the substrate 26 and transducer 28 are coated the sputtering equipment 30 is rotated away from the substrate 26 and transducer 28 and out of the pressing path P and into a home position, shown in solid.

The sputtering equipment 30 is moved into and out of alignment with the substrate 26 and transducer 28 and the path of the press by way of a programmable stepper motor 34 as shown in FIG. 2. A programmable stepper motor 34 of the type manufactured by Aerotech Unidex using a controller described by part number UIC-LM-A-40 and a 50:1 motor described by part number 300SMC3HX/NE34 is sufficient. The stepper motor 34 can be programmed to supply both an oscillating motion covering the width of the substrate when the sputtering equipment 30 is in the sputtering position and movement of the sputtering equipment 30 into the sputtering position and back to the home position. The movement of the sputtering equipment 30 can also be controlled by a simple motor with encoder and feedback and a series of gears or cams to provide the required motions. Both methods of controlling the rotating support arm are well known in the art.

The hollow rotating support arm passes into the vacuum chamber 10 through a standard Ferro Fluidics rotary feedthrough 16 and the rotary feedthrough port 14. The rotary feedthrough 16 allows for rotational motion of the arm 32 without compromising the vacuum in the chamber. Outside of the chamber the hollow rotating support arm connects to the stepper motor 34 using a key 40 and flex coupling 38. The flex coupling 38 is connected to the stepper motor 34 through stepper motor reduction gear 36.

The flex coupling 38 and the stepper motor reduction gear 36 perform important safety functions. The flex coupling 38 limits the amount of torque applied to the hollow rotating support arm 32. In the event of a program failure, the flex coupling 38 acts like a fuse. If the hollow rotating support arm 32 were to attempt to rotate out of the normal operating positions, such as toward the chamber wall, the flex coupling 38 would shear and disconnect the stepper motor 34.

Figure 4:
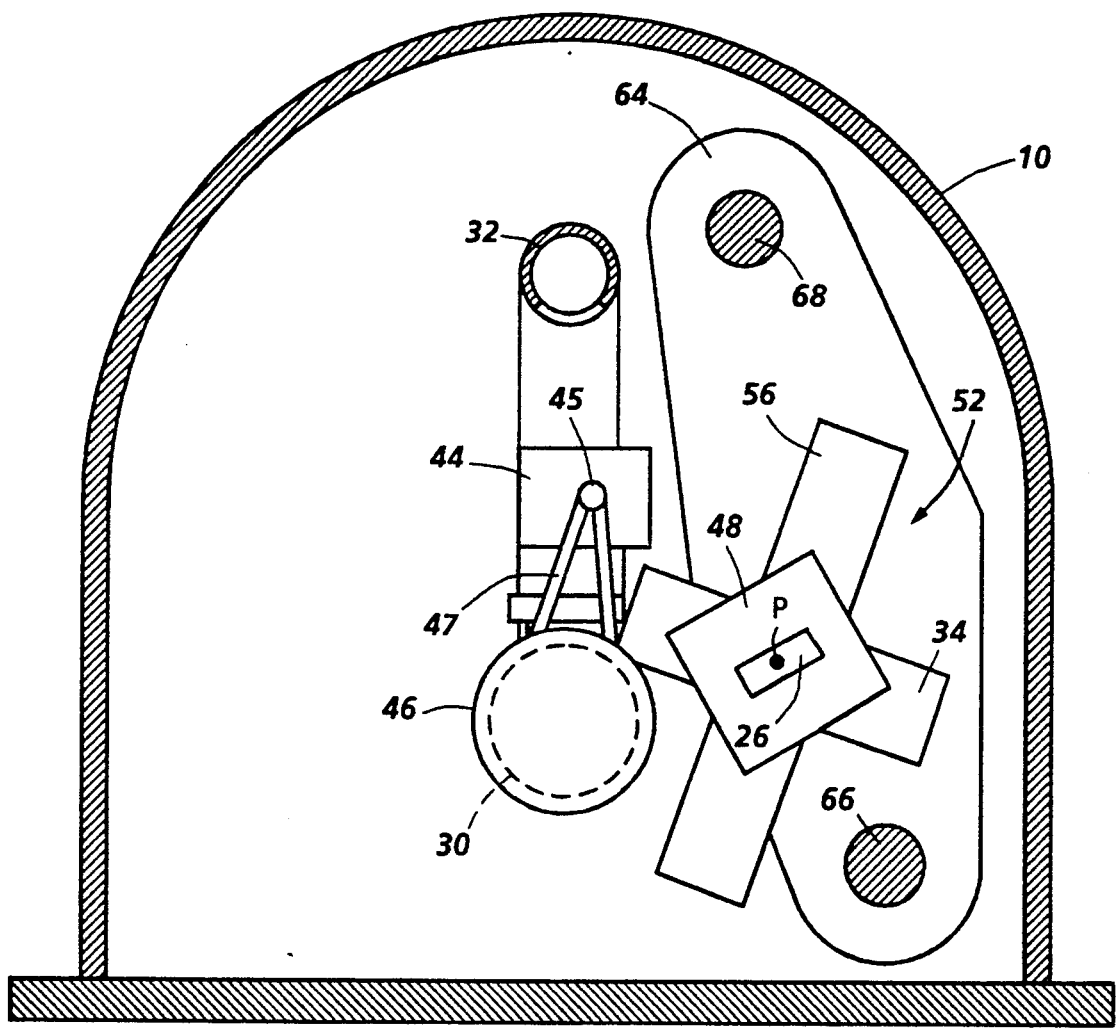
FIG. 4 is a detailed drawing of a rotating support arm inside the vacuum chamber showing water and electrical connections to a solenoid and a dual sputtering equipment.
Figure 5:
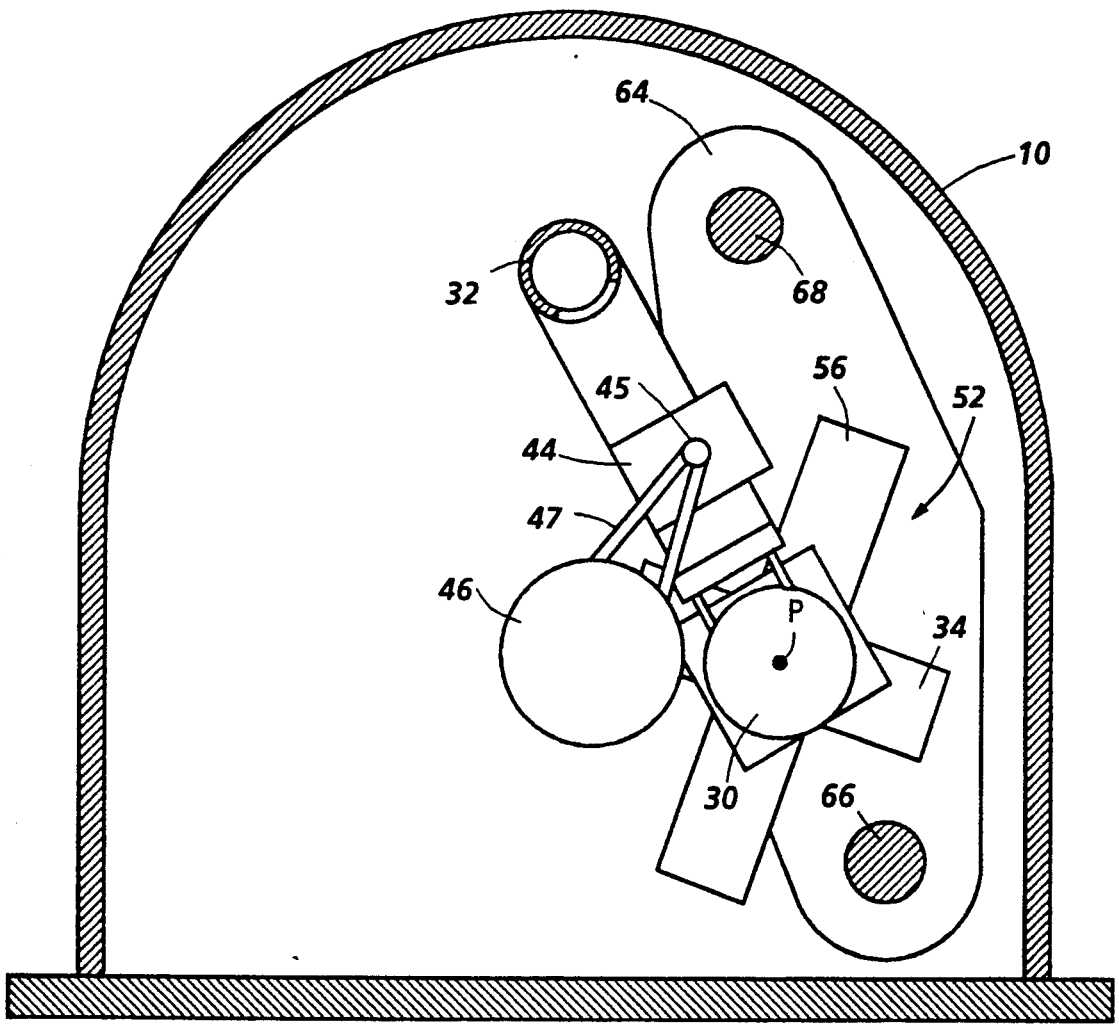
FIG. 5 is a cross sectional view of the electrical connection port inside the hollow rotating support arm taken through lines 5—5 in FIG. 4.

A platform arm 33, with an attached rotary solenoid 44, extends from the hollow rotating support 32. The rotary solenoid 44 moves a pivotally mounted shutter 46 to a blocking position to block the loose atoms from the target from coating the substrate 26 or transducer 28 as shown in FIG. 5, or to a sputtering operating position which is away from the sputtering equipment 30 to allow the loose atoms to coat the substrate 26 or transducer 28. The sputtering equipment 30 is turned on and allowed to clean up the target with the shutter 46 positioned over the target 76 and blocking the flow of metal target atoms as shown in FIG. 4. To start metalization of the substrate 26 or transducer 28, the shutters 46 are moved so that they are no longer positioned over the sputtering equipment 30 as shown in FIG. 5. The shutters 46 are again moved over the sputtering equipment 30 and between it and the substrate 26 and transducer 28 as shown in FIG. 4 when it is desired to stop coating the substrate 26 or transducer 28.

Figure 6:
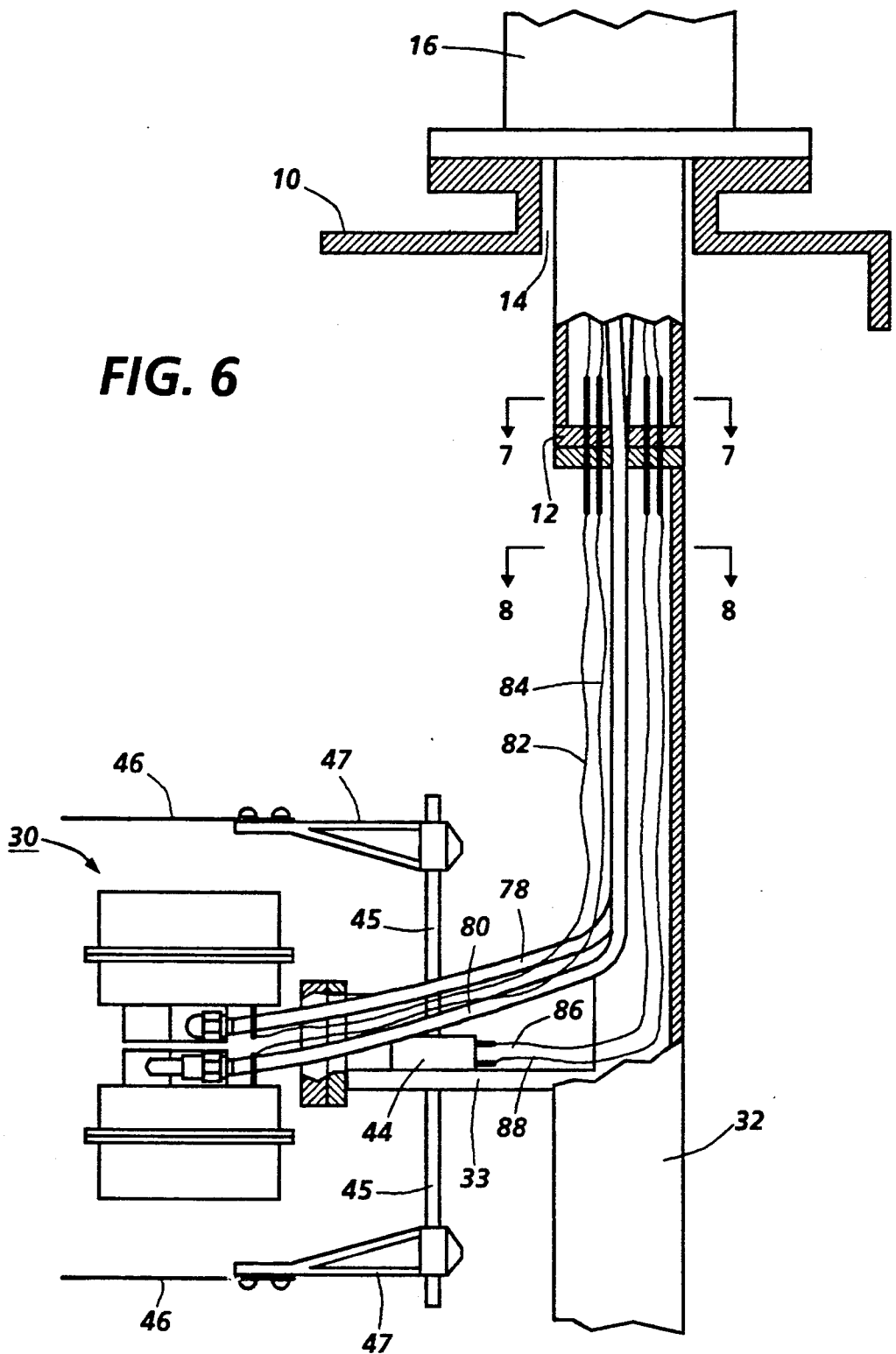
FIG. 6 is a cross sectional view of the hollow rotating support arm taken through lines 6—6 in FIG. 4.
Figure 7:
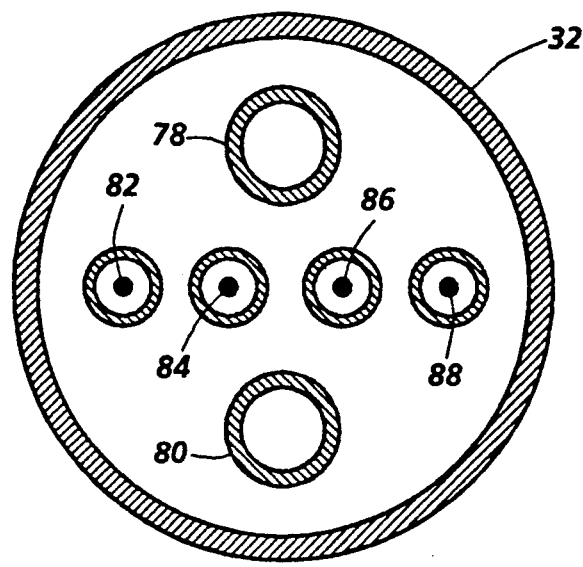
FIG. 7 is a cross sectional view of the dual sputtering equipment.
Figure 8:
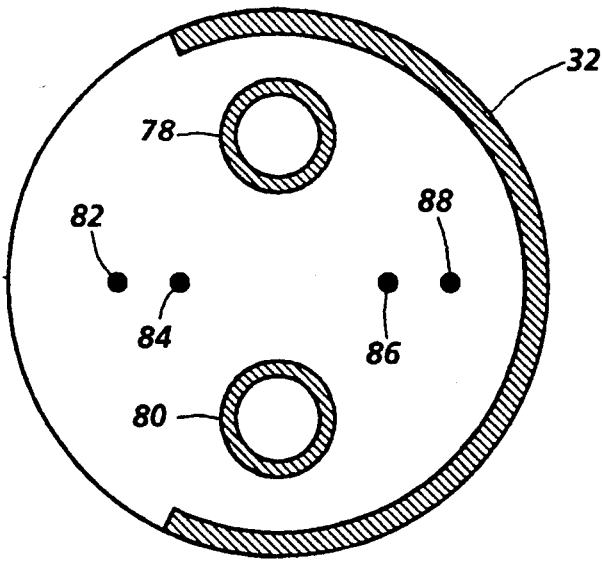
FIG. 8 is a cross sectional view of the dual sputtering equipment from above and taken through line 8—8 in FIG. 7.

Electrical and cooling water connections to the sputtering equipment 30 and the rotary solenoid 44 are made through the water and electrical feedthrough 42 which is inside the hollow rotating support arm 32 as shown in FIG. 6. Cross sectional details of the electrical and water connections are shown in FIGS. 7, and 8. The port is designed to provide the necessary connections without compromising the low vacuum pressure required for thin film coating and vacuum cold welding. The electrical lines 82, 84, 86, 88 pass from outside the vacuum chamber 10, into the the hollow rotating support arm 32, through the sealed electrical connection port 14 inside the rotating support arm and out into the vacuum chamber to be connected to the sputtering equipment 30 and the rotary solenoid 44. This same port is also used for the water lines 78, 80 providing water connections to the sputtering equipment 30. The electrical connection port does not need to be enclosed within the hollow rotating support arm 32 but it is convenient since it avoids an additional hole into the vacuum chamber 10 which would need to be sealed. Since the rotary solenoid 44 and the sputtering equipment 30 are mounted on the hollow rotating support arm 32 the wires are held protected inside the hollow rotating support arm 32 with a minimum of stress during movement of the sputtering equipment 30 and the rotary solenoid 44 as shown in FIGS. 3, 4, and 5.

The rotary solenoid 44 is vacuum rated and functions as a standard rotary solenoid. The solenoid 34 has been constructed out of special materials to eliminate outgassing which would compromise the vacuum inside the chamber. The magnet wire is insulated with polyimide and the wire junctions are covered with polyolefin. The bearings are constructed out of stainless steel. Hard chrome, nickel electroless or reflowed tin plating is used instead of brass plating. A dry lubricant of ML-varnish is used instead of normally used enamel or teflon. A solid lubricant of electrofilmed molybdenum disulfide is used. The rotary solenoid 44 has a temperature rating from $-55$ degrees centigrade to 175 degrees centigrade.

As an alternative, the shutter 46 and the rotary solenoid 44 can be mounted on the inside wall of the chamber as is done in conventional systems. However, mounting the rotary solenoid 44 and the shutter 46 from the inside wall would necessitate complex motor programming and complex mechanisms to insure movement of the shutter 46 coincident with the sputtering equipment 30 since the shutter 46 would be mounted separately from the sputtering equipment 30. Also an additional hole would have to be provided in the vacuum chamber for the electrical connections 86,88.

When the electrical connections for the solenoid use the same electrical connection port 14 that the sputtering equipment 30 uses, the need for an additional port in the vacuum chamber 10, as in conventional systems, for controlling the shutter 46 is eliminated. Reduction in the number of ports and hence a reduction in the number of seals to leak and compromise the vacuum of the chamber leads to better maintenance of the integrity of the vacuum inside the vacuum chamber 10 and an increase in pumping speed for the vacuum chamber 10.

The substrate 26 and transducer 28 are mounted on two chucks 48, and 50. One chuck 48 is attached to a double gimbal assembly 52. The process of rendering the substrate 26 and transducer 28 coplanar to each other immediately before and during pressing is called planarization and is accomplished by the double gimbal assembly 52 using an upper gimbal 54 and a lower gimbal 56. For details of the double gimbal assembly 52 and its operation, please refer to copending application by Eskandari et al. titled Orthogonal Gimbals for Automatic Self-Planarization, Ser. No. 07/673,890, filed on Mar. 22, 1991, abandoned (common assignee) and incorporated herein by reference.

The second chuck 50 is mounted to a connecting rod 58. The connecting rod 58 and chuck 50 are pushed toward the first chuck 48 by a piston (not shown) attached to a piston rod 60 mounted outside the vacuum chamber 10. A bellows seal 70 maintains the integrity of the high vacuum pumping system 22 while allowing movement of the connecting rod 58. The connecting rod is attached to a die set for stability during pressing. The die set includes a moveable upper shoe 62 and a fixed lower shoe 64. The upper shoe 62 slides on spaced guide shafts 66, 68 (FIG. 3) during pressing.

The first chuck 48, which is mounted on the gimbal assembly 52, incorporates a tight clamp 48 which holds the substrate 26 during bonding and the bonded pair after bonding. The second chuck 40, which is mounted on the connecting rod 58 assembly, secures the first transducer 28 by a loose clamp (not shown) which releases after bonding in order to avoid strain on the bonded pair.

Figure 9:
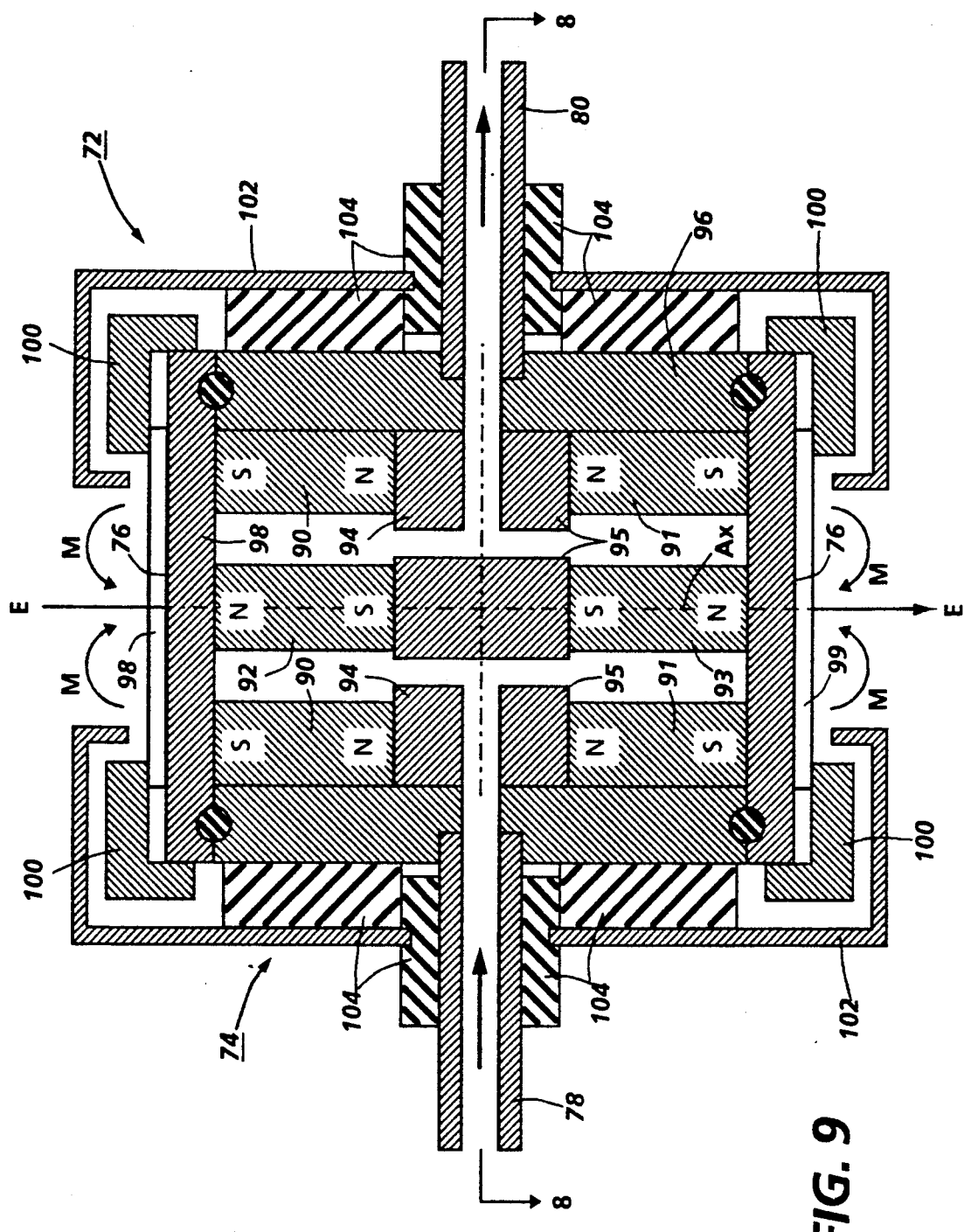
FIG. 9 is a cross-sectional view of the dual sputtering equipment in another embodiment.
Figure 10:
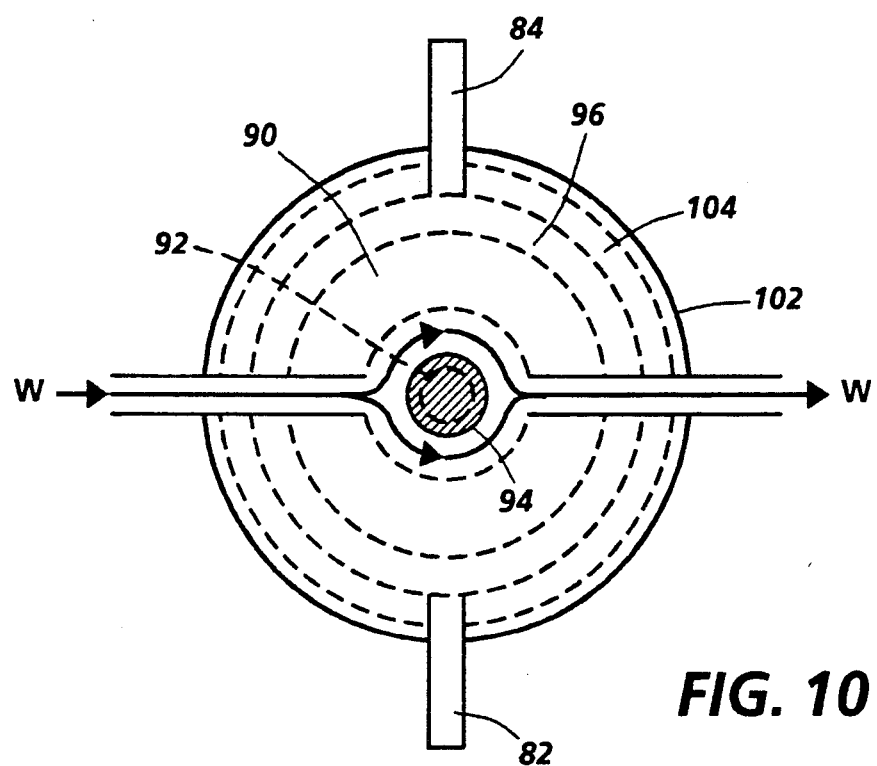
FIG. 10 is a cross-sectional view of the dual sputtering equipment taken through line 8—8 in FIG. 9.

A dual sputtering device 72, shown in FIGS. 9 and 10, may be used in place of the sputtering equipment 30 to coat substrate 26 and transducer 28 simultaneously. The simultaneous, rather than sequential, coating of the dual sputtering device 72 increases the throughput of the cold welding system.

The basic components of the dual sputtering device 72, as shown in FIG. 9, are two sputtering heads 74 and two targets 76. The dual sputtering device 72 has symmetry about axis $A_x$. Two ring magnets 90, 91 and two cylinder magnets 92, 93 one for each sputtering head 74, generate magnetic fields M. The ring magnets 90, 91 and the cylinder magnets 92,93 are each mounted on a magnetic yoke 94, 95. The magnet and yoke assembly is placed in a hollow cylindrical housing 96 and secured in place with two end disks 98, 99. Each target 76 is held in place by two target clamps 100. The input 78 and output 80 water lines and input 82 and output 84 electrical lines can be welded in place. An external housing 102 holds the entire assembly together including insulators 104. Cooling water flows along water path W and, as shown in FIG. 10, circulates around the cylinder magnets 92 and 93 and between the cylinder magnet 92 and the ring magnet 90.

During operation, each sputtering head 74 generates an electric field normal to its target 76 and a magnetic field M in an anulus, near the periphery of its target 76. Electrons are trapped by the crossed electric E and magnetic fields E,M enabling efficient ionization of the process gas at low pressures. The process gas ions are accelerated to the target 76 by the electric field E and target atoms are knocked off. The loose target atoms then deposit on the substrate 26 or transducer 28 as a thin film. As long as the substrate 26 or transducer 28 is aligned with the target to receive the target 76 atoms, any directional orientation of the sputterer to the substrate 26 or transducer 28, either horizontal, vertical, or some intermediate angle, may be used. Thermal sources which have a strong directional orientation can not perform this function. Thermal sources are able to effectively coat upwards only. Film quality is more uniform with the sputtering device 48 than with a thermal source since a sputtering device 72 does not have the problems of spitting and boiling that are common with thermal sources.

Film uniformity can be greatly increased by oscillating the dual sputtering device 72 during the deposition process. Preferably, the oscillation should be a regular periodic motion and several cycles of oscillation should occur during the sputtering deposition time. Some regular non-periodic motions such as spirals are also suitable for some applications. It has been found in tests that with no oscillation the thickness of the metalized coating at one inch from the center is equal to approximately 87% of the thickness of the coating at the center. Under simulation, a 1.75 inch oscillation amplitude using a 2 inch diameter target approximately 3.5 inches above a substrate, the thickness of the coating at one inch from the center is 93% of the thickness of the coating at the center. These parameters give relatively uniform coverage over a 1 inch wide substrate. The number of oscillations needed will vary according to the desired thickness of the metalized coating. A calculation of the time needed for a given thickness is first done. The oscillations are then programmed to give continuous oscillation during the required time period. In the described application, 18 oscillations were used.

We claim:

1. A dual sputtering device comprising:
   a housing,
   two adjacent sputtering sections within said housing arranged along a common axis; each said section having a ring magnet circumscribed around said axis and a pole magnet, the center of which generally extends along said axis; said ring magnets being axially spaced from each other; said pole magnets being axially spaced from each other and each being surrounded by a respective one of said ring magnets;
   a generally annular space between each said pole magnets and a respective one of said ring magnets; each section having a target extending in a plane which is generally perpendicular to the said axis; said targets being axially spaced from each other and being located on the outer surface of said housing at opposite axial ends of said housing; said housing having fluid inlet means and fluid outlet means; passage means connecting said generally annular space of one section with said generally annular space of the other section, said passage means being annular and co-extensive with and located between said generally annular spaces of said sections; said fluid inlet means opening into said passage means upstream of fluid flow and said fluid outlet means opening into said passage means downstream of fluid flow whereby fluid entering said housing through said inlet means will circulate through said passage means and said annular spaces and out of said housing through said outlet means; and electrical means connected to said targets for creating electric fields across said targets upon activation of said electrical means.

2. The structure as recited in claim 1 wherein said fluid inlet means and said fluid outlet means are generally aligned transverse to said axis and spaced generally opposite from each other along said passage means.

* * * * *